US00RE42332E

(19) United States
(12) Reissued Patent
Zhao et al.

(10) Patent Number: US RE42,332 E
(45) Date of Reissued Patent: May 10, 2011

(54) INTEGRATED CIRCUIT PACKAGE, BALL-GRID ARRAY INTEGRATED CIRCUIT PACKAGE

(75) Inventors: Lily Zhao, San Jose, CA (US); Dexin Liang, Freemont, CA (US)

(73) Assignee: Taiwan Semiconductor Manufacturing Company, Ltd., Hsin-Chu (TW)

(21) Appl. No.: 12/629,951

(22) Filed: Dec. 3, 2009

Related U.S. Patent Documents

Reissue of:
(64) Patent No.: 6,630,737
Issued: Oct. 7, 2003
Appl. No.: 09/405,375
Filed: Sep. 24, 1999

U.S. Applications:
(62) Division of application No. 09/330,241, filed on Jun. 10, 1999, now Pat. No. 6,207,476.

(51) Int. Cl.
*H01L 23/48* (2006.01)

(52) U.S. Cl. ..... 257/738; 257/698; 257/774; 257/778; 257/780

(58) Field of Classification Search ..... 257/738, 257/698, 774, 778, 780
See application file for complete search history.

(56) References Cited

U.S. PATENT DOCUMENTS

| | | | | |
|---|---|---|---|---|
| 5,399,898 | A | 3/1995 | Rostoker | 257/499 |
| 5,406,025 | A | 4/1995 | Carlstedt | 174/17.08 |
| 5,422,441 | A * | 6/1995 | Iruka | |
| 5,492,863 | A | 2/1996 | Higgins, III | 437/183 |
| 5,615,089 | A * | 3/1997 | Yoneda et al. | |
| 5,796,170 | A | 8/1998 | Marcantonio | |
| 5,885,855 | A | 3/1999 | Liang | 438/128 |
| 5,898,217 | A | 4/1999 | Johnston | 257/691 |
| 5,909,054 | A * | 6/1999 | Kozono | 257/738 |
| 5,959,356 | A * | 9/1999 | Oh | 257/738 |
| 5,985,695 | A | 11/1999 | Freyman et al. | 438/112 |
| 5,994,766 | A | 11/1999 | Shenoy et al. | 257/659 |
| 6,037,677 | A * | 3/2000 | Gottschall et al. | |
| 6,038,136 | A * | 3/2000 | Weber | 257/738 |
| 6,211,576 | B1 * | 4/2001 | Shimizu et al. | |

OTHER PUBLICATIONS

Texas Instruments, "Fixed-Point Digital Signal Processor," TMS320VC549, IEEE Standard 1149.1-1990 Standard-Test-Access Port and Boundary Scan Architecture, Oct. 2004, 64 pages.

* cited by examiner

*Primary Examiner* — Walter L Lindsay, Jr.
(74) *Attorney, Agent, or Firm* — Slater & Matsil, L.L.P.

(57) ABSTRACT

The present invention includes an integrated circuit package, a ball-grid array integrated circuit package, a method of packaging an integrated circuit, and a method of forming an integrated circuit package. According to one aspect, the present invention provides an integrated circuit package including a substrate including a first surface, a second surface and a plurality of conductors, the first surface includes a plurality of conductive pads adapted to couple with a plurality of corresponding bond pads of a semiconductor die, and the conductors being configured to couple the conductive pads with the second surface; and a plurality of conductive bumps coupled with the second surface of the substrate and electrically coupled with respective conductors, the conductive bumps being formed in an array including a plurality of power bumps and signal bumps, and the signal bumps being individually positioned immediately adjacent at least one power bump. One method of packaging an integrated circuit includes providing a semiconductor die including a plurality of bond pads; providing a package substrate including a plurality of conductive bumps including plural power bumps and plural signal bumps; arranging individual signal bumps to be immediately adjacent at least one power bump; and electrically coupling the bond pads of the semiconductor die with respective conductive bumps.

25 Claims, 4 Drawing Sheets

INTEGRATED CIRCUIT PACKAGE, BALL-GRID ARRAY INTEGRATED CIRCUIT PACKAGE

Matter enclosed in heavy brackets [ ] appears in the original patent but forms no part of this reissue specification; matter printed in italics indicates the additions made by reissue.

RELATED PATENT DATA

This patent resulted from a divisional application of U.S. patent application Ser. No. 09/330,241, filed Jun. 10, 1999, now U.S. Pat. No. 6,207,476 entitled "Integrated Circuit Package, Ball-Grid Array Integrated Circuit Package and Methods of Packaging an Integrated Circuit", naming Lily Zhao et al. as inventors, the disclosure of which is incorporated by reference.

TECHNICAL FIELD

The present invention relates to integrated circuit packages, ball-grid array integrated circuit packages, and methods of packaging an integrated circuit.

BACKGROUND OF THE INVENTION

Integrated circuit devices are utilized in an ever-increasing number of applications. Exemplary integrated circuit devices include processing devices for manipulating data and memory devices for storing data. Numerous packaging technologies have emerged for housing integrated circuit devices.

Integrated circuit devices are typically mechanically and electrically coupled with an associated substrate. Initially, dual in-line packages (DIPs) were utilized to mount integrated circuits. Dual in-line packages typically include a flat rectangular body and a plurality of leads. The leads are provided in parallel rows at right angles to the body. Plastic dual in-line packages were fabricated by molding epoxy resin on a stamped leadframe which included the integrated circuit device.

Improved mounting and packaging technologies have been developed to provide integrated circuit devices which offer improved operational characteristics. Further, recently introduced device packaging configurations provide an increased number of connections to meet modern semiconductor device demands. For example, the lower surfaces of integrated circuit packages have been utilized to increase the number of connections which can be made to a particular device.

One exemplary packaging technology which provides the aforementioned benefits are ball-grid array (BGA) packages. Ball-grid array devices individually include a flat package utilized for surface mounting a large-scale integrated circuit upon a circuit board or other substrate. Ball-grid array packages have a plurality of solder bumps (balls) which are utilized in place of pins to provide electrical and mechanical connection of the integrated circuit package to a circuit board. Such packages are referred to as fine pitch ball-grid array (FBGA) packages for applications wherein the pitch of the balls is 1 mm or less.

BRIEF DESCRIPTION OF THE DRAWINGS

Preferred embodiments of the invention are described below with reference to the following accompanying drawings.

FIG. 4 is a plan view of an intermediate layer of the printed circuit board of FIG. 3.

DETAILED DESCRIPTION OF THE PREFERRED EMBODIMENTS

Figure 1:
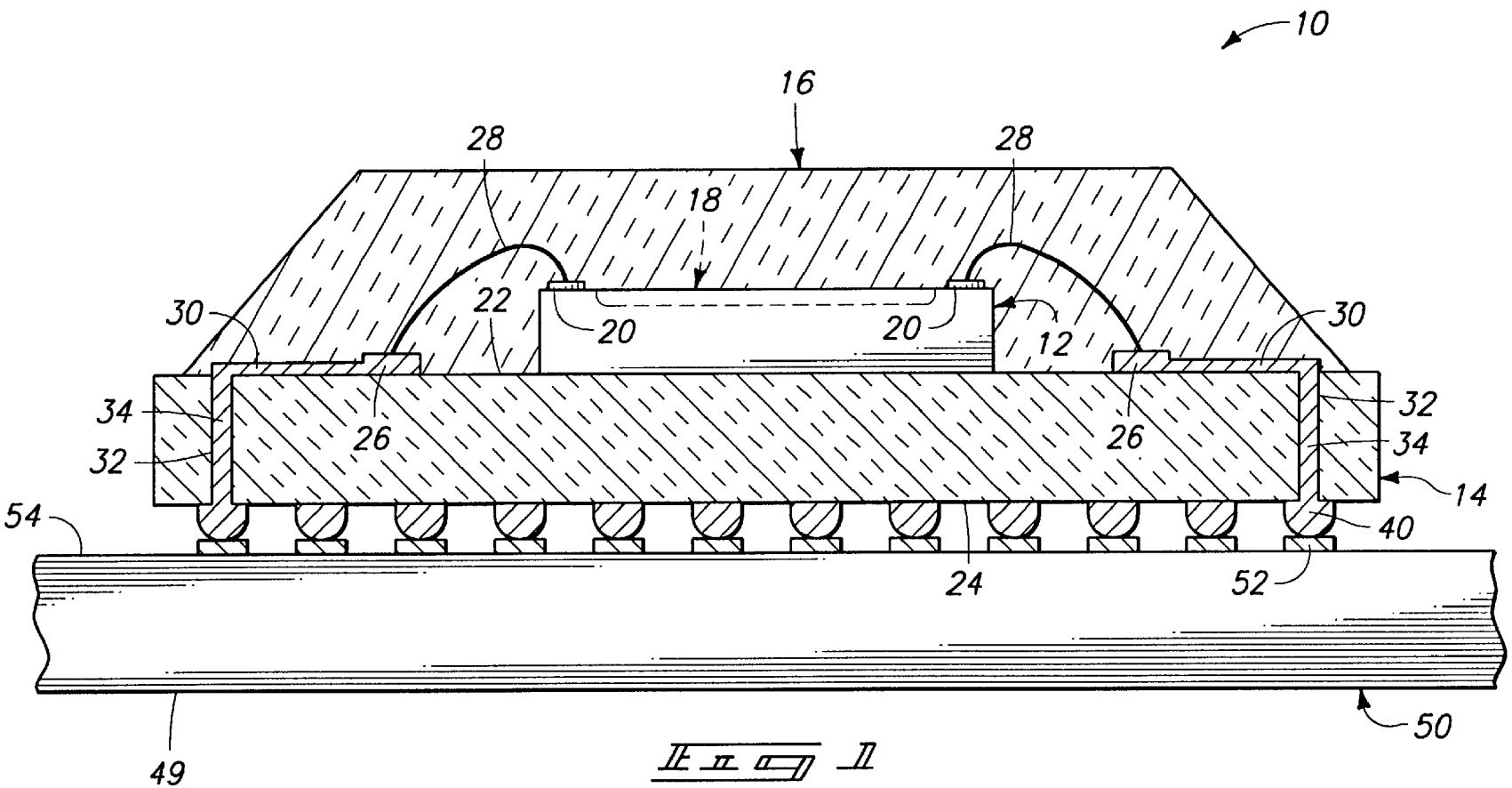
FIG. 1 is a side cross-sectional view of an integrated circuit package.

This disclosure of the invention is submitted in furtherance of the constitutional purposes of the U.S. Patent Laws "to promote the progress of science and useful arts" (Article 1, Section 8).

One aspect of the present invention provides an integrated circuit package comprising: a substrate including a first surface, a second surface and a plurality of conductors, the first surface includes a plurality of conductive pads adapted to couple with a plurality of corresponding bond pads of a semiconductor die, and the conductors being configured to couple the conductive pads with the second surface; and a plurality of conductive bumps coupled with the second surface of the substrate and electrically coupled with respective conductors, the conductive bumps being formed in an array including a plurality of power bumps and signal bumps, and the signal bumps being individually positioned immediately adjacent at least one power bump.

A second aspect of the present invention provides an integrated circuit package comprising: a substrate including a first surface, a second surface and a plurality of conductors, the first surface includes a plurality of conductive pads adapted to couple with a plurality of corresponding bond pads of a semiconductor die, and the conductors being configured to couple the conductive pads with the second surface; and a plurality of conductive bumps coupled with the second surface and electrically coupled with respective conductors of the substrate, the conductive bumps including a plurality of power bumps and signal bumps formed in an array having plural sides individually comprising at least a majority of signal bumps.

According to another aspect, the present invention provides a ball-grid array integrated circuit package comprising: a semiconductor die having a plurality of bond pads; a substrate including a first surface including a plurality of conductive pads, a second surface, and a plurality of conductors to electrically couple the conductive pads of the first surface with the second surface, the semiconductor die being coupled with the first surface and the bond pads being electrically coupled with the conductive pads and the conductors; a plurality of conductive balls coupled with the second surface and electrically coupled with respective ones of the conductors, conductive pads and bond pads, the conductive balls including a plurality of power balls and signal balls formed in an array having plural sides; and wherein individual signal balls are positioned immediately adjacent at least one power ball, and the sides of the array individually comprise at least a majority of signal balls.

Another aspect of the present invention provides a ball-grid array integrated circuit package comprising: a semiconductor die including integrated circuitry electrically coupled with a plurality of bond pads; a substrate including a first surface including a plurality of conductive pads, a second surface, and a plurality of vias including respective via conductors to electrically couple the conductive pads of the first surface with the second surface, the semiconductor die being coupled with the first surface; plural wire bonding connections configured to electrically couple the bond pads with the conductive pads and the via conductors; a plurality of conductive balls coupled with the second surface and adapted to electrically couple ones of the conductors, conductive pads and bond pads with external circuitry, and including a plurality of power balls and signal balls formed in an array having plural sides; and wherein individual signal balls are positioned immediately adjacent at least one power ball, and the sides of the array individually comprise signal balls.

Another aspect provides a method of packaging an integrated circuit comprising: providing a semiconductor die including a plurality of bond pads; providing a package substrate including a plurality of conductive bumps including plural power bumps and plural signal bumps; arranging individual signal bumps to be immediately adjacent at least one power bump; and electrically coupling the bond pads of the semiconductor die with respective conductive bumps.

Another aspect of the present invention provides a method of packaging an integrated circuit comprising: providing a semiconductor die including a plurality of pads; providing a package substrate including a plurality of conductive bumps arranged in an array including plural power bumps and plural signal bumps; arranging plural sides of the array to individually include at least a majority of signal bumps; and electrically coupling the pads of the semiconductor die with respective conductive bumps.

According to another aspect, the present invention provides a method of forming an integrated circuit package comprising: providing a package substrate including a plurality of conductive bumps including plural power bumps and plural signal bumps; and arranging individual signal bumps to be immediately adjacent at least one power bump.

According to yet another aspect, the present invention provides a method of packaging an integrated circuit comprising: providing a package substrate including a plurality of conductive bumps arranged in an array including plural power bumps and plural signal bumps; and arranging plural sides of the array to individually include a majority of signal bumps.

Referring to FIG. 1, an integrated circuit package 10 is illustrated. Integrated circuit package 10 comprises a ball-grid array (BGA) package or fine pitch ball-grid array (FBGA) package in the described embodiment. However, the present invention is applicable to other integrated circuitry packaging technologies.

The depicted integrated circuit package 10 includes a semiconductor die 12 and a package substrate 14. Package substrate 14 comprises a printed circuit board (PCB) in an exemplary embodiment. Package substrate 14 includes a first surface 22 and an opposing second surface 24. Semiconductor die 12 is attached to surface 22 of package substrate 14 using an adhesive (not shown) or other attachment technique. Integrated circuit package 10 additionally includes a housing 16 defined by an encapsulant, such as epoxy.

Semiconductor die 12 includes integrated circuitry 18 coupled with a plurality of bond pads 20. Integrated circuitry 18 of semiconductor die 12 includes processing circuitry or memory circuitry in exemplary configurations.

Surface 22 of package substrate 14 supports a plurality of conductive pads 26 coupled with respective conductive traces 30. Conductive pads 26 are provided to electrically couple with bond pads 20 of semiconductor die 12. Wire bonding connections 28 are utilized in the described embodiment to electrically couple bond pads 20 with conductive pads 26. Other electrical connection configurations can be utilized to couple bond pads 20 with conductive pads 26.

Package substrate 14 includes a plurality of vias 32 formed intermediate first surface 22 and second surface 24. Plural via conductors 34 are provided within respective vias 32. Via conductors 34 can electrically couple conductive pads 26 upon first surface 22 with second surface 24. Only two exemplary vias 32 are illustrated in FIG. 1. Typically, substrate 14 includes hundreds of vias 32 and via conductors 34 to provide appropriate electrical connections intermediate integrated circuitry 18 and external circuitry or power sources (not shown).

Package substrate 14 can include power and ground connections for coupling with selected conductive pads 26 and bond pads 20 of semiconductor die 18. Although not depicted in FIG. 1, such power and ground connections can comprise conductive planes extending substantially throughout the length of package substrate 14.

As depicted in FIG. 1, a plurality of conductive bumps 40 are provided upon second surface 24 of package substrate 14. Conductive bumps 40 individually comprise a conductive material, such as solder. Conductive bumps 40 are coupled with respective via conductors 34. Although only two of conductive bumps 40 are illustrated coupled with via conductors 34 in the illustrated configuration of FIG. 1, typically all of the conductive bumps 40 are coupled with respective ones of via conductors 34.

Conductive bumps 40 are electrically coupled with respective via conductors 34, conductive pads 26, traces 30, wire bonding connections 28, and bond pads 20 of semiconductor die 18. Conductive bumps 40 are configured to couple respective bond pads 20 of semiconductor die 18 with external circuitry.

In the depicted configuration, conductive bumps 40 of integrated circuit package 10 are coupled with external circuitry comprising an external substrate 50 in the depicted arrangement. An exemplary external substrate 50 comprises a motherboard. External substrate 50 includes opposing surfaces 49, 54. A plurality of conductive pads 52 configured to couple with respective conductive bumps 40 are provided upon upper surface 54 of external substrate 50. Plural conductive traces (shown in FIG. 3 and FIG. 4) can be coupled with individual conductive pads 52 to provide electrical coupling of respective conductive bumps 40 with circuitry external of integrated circuit package 10.

Although not distinguished as such in FIG. 1, conductive bumps 40 define either a power conductor or an input/output (I/O) signal conductor. Exemplary power conductors are configured to provide coupling with voltage references such as first and second different voltage values VDD and VSS. I/O signal conductors are configured to pass input/output signals intermediate semiconductor die 12 and integrated circuitry 18. In an exemplary embodiment, data is inputted to and outputted from semiconductor die 12 via such I/O signaling conductors.

As mentioned above, the depicted integrated circuit package 10 comprises a ball-grid array (BGA) package wherein conductive bumps 40 comprise solder balls. In one embodiment, integrated circuit package 10 comprises a fine pitch ball-grid array (FBGA) where the pitch of solder ball conductive bumps 40 is one millimeter or less.

Figure 2:
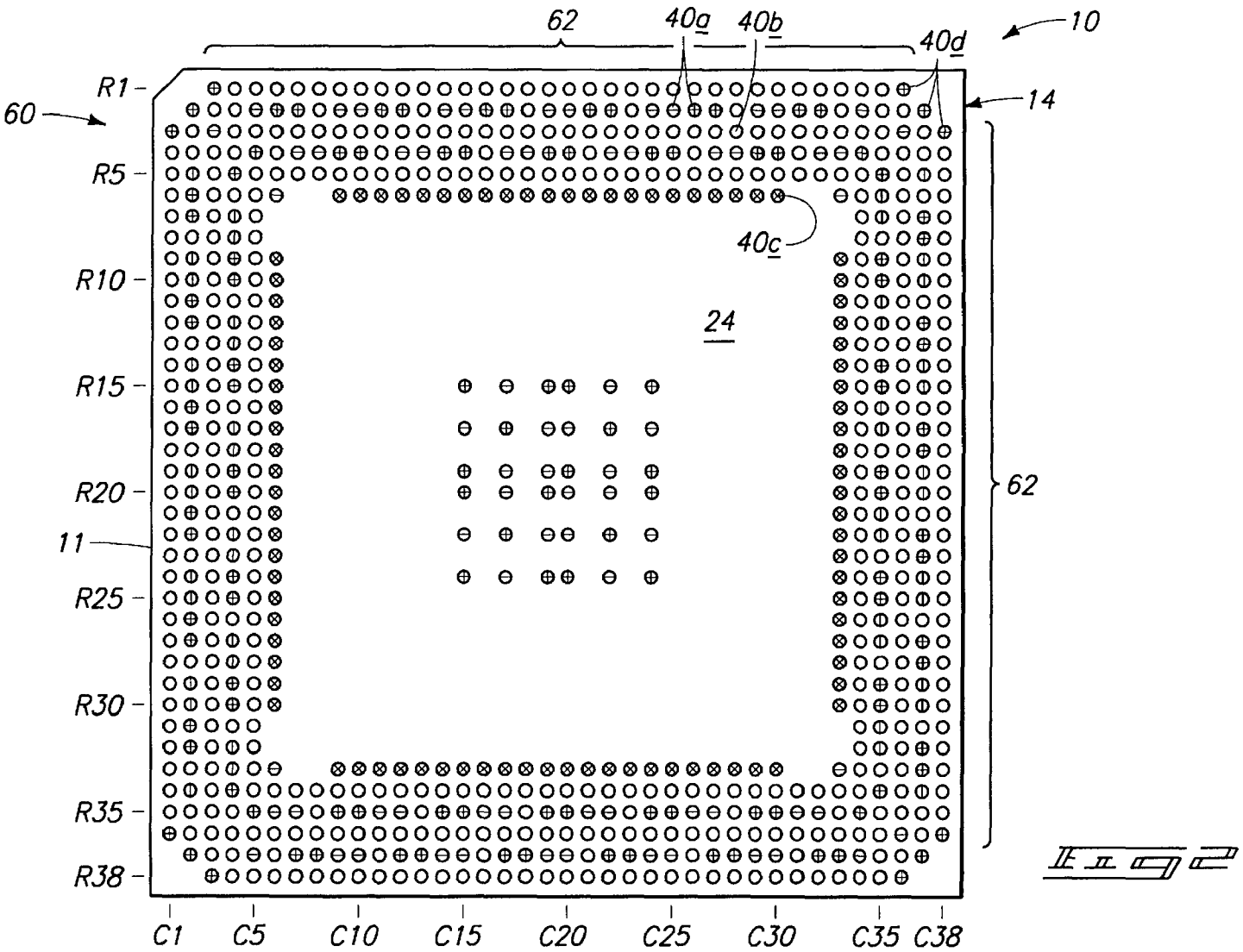
FIG. 2 is a plan view of a lower surface of the integrated circuit package of FIG. 1.

Referring to FIG. 2, a plurality of conductive bumps 40 upon surface 24 of package substrate 14 are illustrated. Conductive bumps 40 are arranged in an array 60 upon substrate surface 24. The depicted array is exemplary and conductive bumps 40 can be arranged in other desired configurations in accordance with the present invention.

The depicted conductive bumps 40 include plural power bumps 40a, signal bumps 40b, differential bumps 40c, and corner bumps 40d. Power bumps 40a can comprise VSS bumps represented by a minus sign and VDD power bumps represented by a plus sign. Signal bumps 40b are preferably individually positioned immediately adjacent at least one power bump 40a and can be individually configured to communicate one of input signals and output signals. Positioning of signal bump 40b adjacent at least one power bump 40a reduces noise within the signals communicated within the individual signal bumps 40b.

Differential signaling bumps 40c communicate differential signals and typically may be spaced from power bumps 40a without adverse performance results. Alternatively, differential signaling bumps 40c may be individually placed immediately adjacent at least one power bump 40a in another arrangement. Corner bumps 40d are diagonally arranged intermediate adjacent sides in the depicted arrangement.

The depicted conductive bump array 60 includes a plurality of sides 62. Sides 62 in the present description individually include conductive bumps 40 within row R1 and columns C3-C36, column C1 and rows R3-R36, column C38 and rows R3-R36, and row R38 and columns C3-C36, respectively. Array sides 62 preferably individually comprise signal bumps 40b adjacent a periphery 11 defined by package substrate 14 of integrated circuit package 10 as shown. Alternatively, array sides 62 individually comprise a majority of signal bumps 40b. Such enables improved routing with external circuitry coupled with integrated circuit package 10 as described below.

Figure 3:
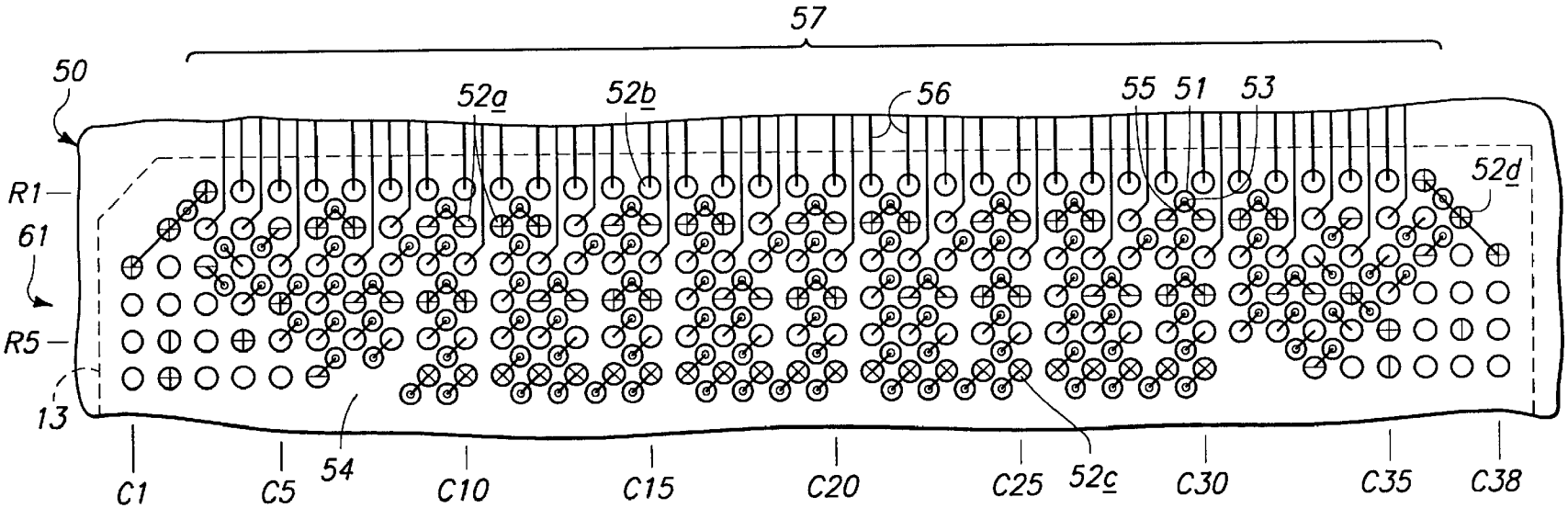
FIG. 3 is a plan view of a surface portion of an exemplary printed circuit board configured to couple with the integrated circuit package of FIG. 1.
Figure 11:
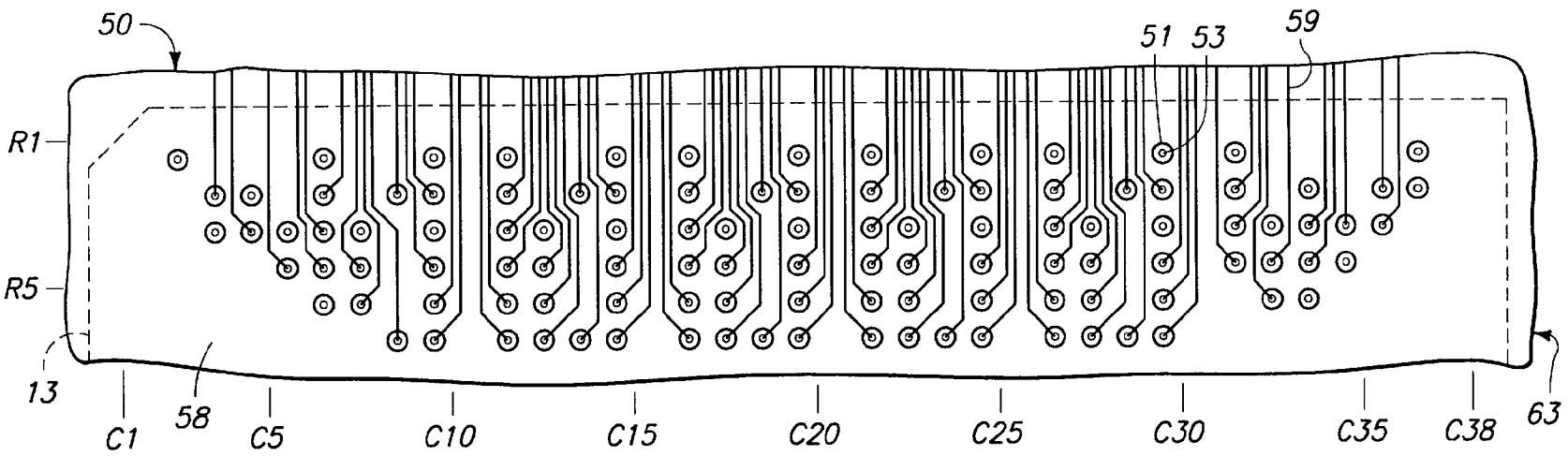

Referring to FIG. 3 and FIG. 4, traces formed upon and within a motherboard substrate 50 are shown. FIG. 3 illustrates a plurality of conductive pads 52 and respective traces formed over surface 54 of external substrate 50. FIG. 4 illustrates a plurality of vias and traces at an intermediate level within external substrate 50. A footprint 13 corresponding to periphery 11 of integrated circuit device 10 is illustrated in FIG. 3 and FIG. 4.

Referring specifically to FIG. 3, a portion of an array 61 of conductive pads 52 configured to couple with conductive bumps 40 of integrated circuit package 10 is depicted. Array 61 includes a plurality of sides 57 although only one such side is illustrated. Sides 57 in the present description include conductive pads 52 corresponding to conductive bumps 40 within row R1 and columns C3-C36, column C1 and rows R4-R36, column C38 and rows R3-R36, and row R3 and columns C3-36, respectively. Although only one portion including one side 57 of array 61 is shown, the illustrated pattern of conductive pads 52 is preferably repeated for the remaining portions and sides 57 of array 61.

The conductive pads 52 illustrated in FIG. 3 are configured to couple directly with corresponding conductive bumps 40 of package substrate 14. Conductive pads 52 include power conductive pads 52a configured to couple with power conductive bumps 40a, signal conductive pads 52b configured to couple with conductive bumps 40b, differential conductive pads 52c configured to couple with differential conductive bumps 40c, and corner conductive pads 52d configured to couple with corner conductive bumps 40d.

A plurality of traces 55, 56 are formed upon surface 54 to provide electrical coupling of conductive pads 52 with other circuit components either provided upon substrate 50 or external to the substrate 50. As illustrated, a plurality of vias 51 are also provided within external substrate 50. Via conductors 53 are provided within respective vias 51. Via conductors 53 are operable to elevationally electrically couple various layers of external substrate 50.

For example, via conductors 53 operate to couple the upper surface shown in FIG. 3 with an intermediate layer of external substrate 50 depicted in FIG. 4. Referring to FIG. 3, a plurality of conductive traces 55 are formed upon surface 54 to couple via conductors 53 with corresponding conductive pads 52. Power conductive pads 52a, differential conductive pads 52c and corner conductive pads 52d are individually coupled with respective traces 55 and via conductors 53 in the depicted arrangement.

The depicted traces 56 upon surface 54 couple conductive pads 52 with circuitry outside of footprint 13 of integrated circuit package 10. As shown in FIG. 4, a plurality of traces 59 operate to couple via conductors 53 with circuitry outside of footprint 13 of integrated circuit package 10 at an intermediate level of substrate 50. Although not shown, other intermediate levels within substrate 50 may be provided.

In the preferred configuration, sides 62 of array 60 include at least a majority of signal conductive bumps 40b. Accordingly, corresponding sides 57 of array 61 include at least a majority of I/O signal conductive pads 52 which correspond to the pattern of conductive bumps 40.

In the depicted configuration, signal conductive pads 52b of sides 57 are coupled with traces 56 which extend across surface 54 of external substrate 50 outside of footprint 13. As such, lateral connections with vias are not necessary for coupling signal conductive pads 52b. Accordingly, real estate (surface area) located laterally and intermediate adjacent signal bumps 52b of sides 57 can be utilized to form traces 56.

More specifically, additional real estate (surface area) is provided intermediate adjacent signal conductive pads 52b of sides 57 enabling additional conductive traces 56 coupled with conductive pads 52 located in the interior of array 61 to pass intermediate adjacent signal conductive pads 52b of sides 57. This provides electrical coupling of an increased number of conductive pads 52 with external circuitry outside of footprint 13 of integrated circuit package 10 using traces 56 formed upon surface 54. Such is provided without having to utilize as many vias 51 and via conductors 53 as would otherwise be required. Such provides the added benefit of reducing the number of layers including conductive circuitry within external substrate 50 compared with other arrangements wherein sides 57 individually include some power conductive pads 52a.

For example, if one of conductive pads 52 located within side 57 were coupled with power (i.e., a power conductive pad 52a) then the real estate adjacent thereto on at least one side would be coupled with a via conductor 53 to provide coupling with the power or ground location coupled at another level of substrate 50. Accordingly, a trace 56 could not be formed over this portion of surface 54 as is provided in the depicted configuration.

Referring to FIG. 4, a plurality of traces 59 are depicted formed upon a surface 58 of an intermediate layer 63 of external substrate 50. Layer 63 is located intermediate opposing surfaces 49, 54 of substrate 50. The depicted vias 51 and via conductors 53 correspond to the depicted vias 51 and via conductors 53 illustrated in FIG. 3. Via conductors 53 are coupled with selected traces 59 upon surface 58 providing coupling with circuitry (not shown) outside of the footprint 13 of integrated circuit package 10. Some via conductors 53 are not coupled with traces 59 formed upon surface 58. Such via conductors 53 are typically coupled with traces formed upon other layers of substrate 50 (not shown).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

[1. A ball-grid array integrated circuit package comprising:

a semiconductor die having a plurality of bond pads;

a substrate including a first surface including a plurality of conductive pads, a second surface, and a plurality of conductors to electrically couple the conductive pads of the first surface with the second surface, the semiconductor die being coupled with the first surface and the bond pads being electrically coupled with the conductive pads and the conductors; and a plurality of conductive balls coupled with the second surface and electrically coupled with respective ones of the conductors, conductive pads and bond pads, the conductive balls including a plurality of power balls and signal balls, wherein a majority of signal balls are individually positioned immediately adjacent at least one power ball.]

2. [The ball-grid array integrated circuit package according to claim 1] *A ball-grid array integrated circuit package comprising:*

*a semiconductor die having a plurality of bond pads;*

*a substrate including a first surface including a plurality of conductive pads, a second surface, and a plurality of conductors to electrically couple the conductive pads of the first surface with the second surface, the semiconductor die being coupled with the first surface and the bond pads being electrically coupled with the conductive pads and the conductors; and*

*a plurality of conductive balls coupled with the second surface and electrically coupled with respective ones of the conductors, conductive pads and bond pads, the conductive balls including a plurality of power balls and signal balls, wherein a majority of signal balls are individually positioned immediately adjacent at least one power ball, and* wherein all of the signal connections are individually positioned adjacent at least one power connection.

3. The ball-grid array integrated circuit package according to claim [1] *2* wherein the sides of the array individually comprise at least a majority of signal balls.

4. The ball-grid array integrated circuit package according to claim [1] *2* wherein the sides of the array individually comprise all signal balls intermediate a plurality of corner balls.

*5. A ball-grid array integrated circuit package comprising:*

*a semiconductor die having a plurality of bond pads;*

*a substrate including a first surface including a plurality of conductive pads, a second surface, and a plurality of conductors to electrically couple the conductive pads of the first surface with the second surface, the semiconductor die being coupled with the first surface and the bond pads being electrically coupled with the conductive pads and the conductors; and*

*a plurality of conductive balls coupled with the second surface and electrically coupled with respective ones of the conductors, conductive pads and bond pads, the conductive balls including a plurality of power balls and signal balls, wherein a majority of signal balls are individually positioned immediately adjacent at least one power ball, wherein the plurality of conductive balls are formed as an array;*

*at least one side of the array individually including at least a majority of signal balls; and*

*at least one row or column of the array individually including at least a majority of power balls.*

*6. The ball-grid array integrated circuit package according to claim 5 wherein the at least one row or column of the array is individually adjacent to the at least one side of the array.*

*7. The ball-grid array integrated circuit package according to claim 6 wherein each of the majority of signal balls in the at least one side of the array is immediately adjacent at least one power ball of the at least one row or column of the array.*

*8. The ball-grid array integrated circuit package according to claim 5 wherein the plurality of conductive balls comprises a center array substantially spaced apart from a periphery array.*

*9. The ball-grid array integrated circuit package according to claim 8 wherein the center array includes a majority of power balls.*

*10. The ball-grid array integrated circuit package according to claim 5 wherein the plurality of power balls are Vss or Vdd balls.*

*11. The ball-grid array integrated circuit package according to claim 5 wherein each of the majority of signal balls in the at least one side of the array is immediately adjacent at least one of the plurality of power balls.*

*12. The ball-grid array integrated circuit package according to claim 5 further comprising a plurality of corner balls diagonally arranged intermediate adjacent sides of the array.*

*13. The ball-grid array integrated circuit package according to claim 5 further comprising an external substrate having a second plurality of conductive pads, individual ones of the second plurality of conductive pads being electrically coupled to respective ones of the plurality of conductive balls.*

*14. The ball-grid array integrated circuit package according to claim 5 wherein the plurality of conductive balls are balls of a ball-grid array integrated circuit package.*

*15. The ball-grid array integrated circuit package according to claim 5 further comprising:*

*plural vias within the substrate; and*

*via conductors within the vias.*

*16. A ball-grid array integrated circuit package comprising:*

*a semiconductor die having a plurality of bond pads;*

*a substrate including a first surface including a plurality of conductive pads, a second surface, and a plurality of conductors to electrically couple the conductive pads of the first surface with the second surface, the semiconductor die being coupled with the first surface and the bond pads being electrically coupled with the conductive pads and the conductors;*

*a plurality of conductive balls coupled with the second surface and electrically coupled with respective ones of the conductors, conductive pads and bond pads, the conductive balls including a plurality of power balls and signal balls, wherein a majority of signal balls are individually positioned immediately adjacent at least one power ball, wherein the plurality of conductive balls are formed as an array;*

*a plurality of sides of the array individually including at least a majority of signal balls; and*

*a plurality of rows or columns of the array individually including at least a majority of power balls.*

*17. The ball-grid array integrated circuit package according to claim 16 wherein the plurality of rows or columns of the array are individually adjacent to at least one of the plurality of sides of the array.*

*18. The ball-grid array integrated circuit package according to claim 17 wherein each of the majority of signal balls in*

*the plurality of sides of the array is immediately adjacent at least one of the majority of power balls in the plurality of rows or columns of the array.*

*19. The ball-grid array integrated circuit package according to claim 16 wherein the plurality of conductive balls comprises a center array substantially spaced apart from a periphery array.*

*20. The ball-grid array integrated circuit package according to claim 19 wherein the center array includes a majority of power balls.*

*21. The ball-grid array integrated circuit package according to claim 16 wherein the plurality of power balls are Vss or Vdd balls.*

*22. The ball-grid array integrated circuit package according to claim 16 wherein each of the majority of signal balls in the plurality of sides of the array is immediately adjacent at least one power ball.*

*23. The ball-grid array integrated circuit package according to claim 16 further comprising a plurality of corner balls diagonally arranged intermediate adjacent sides of the array.*

*24. The ball-grid array integrated circuit package according to claim 16 further comprising an external substrate having a second plurality of conductive pads, individual ones of the second plurality of conductive pads being electrically coupled to respective ones of the plurality of conductive balls.*

*25. The ball-grid array integrated circuit package according to claim 16 wherein the plurality of conductive balls are balls of a ball-grid array integrated circuit package.*

*26. The ball-grid array integrated circuit package according to claim 16 further comprising:*

*plural vias located within the substrate; and*

*via conductors located within the vias.*

* * * * *